United States Patent [19]
Gordon et al.

[11] Patent Number: 4,485,265
[45] Date of Patent: Nov. 27, 1984

[54] PHOTOVOLTAIC CELL

[75] Inventors: Roy G. Gordon, Cambridge; Sarah Kurtz, Somerville, both of Mass.

[73] Assignee: President and Fellows of Harvard College, Cambridge, Mass.

[21] Appl. No.: 443,394

[22] Filed: Nov. 22, 1982

[51] Int. Cl.$^3$ .................................... H01L 31/06
[52] U.S. Cl. .................... 136/255; 136/258; 136/261; 357/30
[58] Field of Search ............ 136/255, 261, 258 AM; 357/30

[56] References Cited

U.S. PATENT DOCUMENTS

| | | | |
|---|---|---|---|
| 4,146,657 | 3/1979 | Gordon | 427/126 |
| 4,265,974 | 5/1981 | Gordon | 428/432 |
| 4,338,482 | 7/1982 | Gordon | 136/256 |
| 4,387,387 | 6/1983 | Yamazaki | 357/30 |

Primary Examiner—Aaron Weisstuch

[57] ABSTRACT

In a photovoltaic cell structure containing a visibly transparent, electrically conductive first layer of metal oxide, and a light-absorbing semiconductive photovoltaic second layer, the improvement comprising a thin layer of transition metal nitride, carbide or boride interposed between said first and second layers.

10 Claims, 3 Drawing Figures

PHOTOVOLTAIC CELL

This invention was made with U.S. Government support and the Government has certain rights in the invention.

This invention relates to photovoltaic cell structures containing a visibly transparent, electrically conductive layer of metal oxide and a light-absorbing semiconductive photovoltaic layer, and pertains more specifically to solar cells for converting sunlight to electricity which include layers of tin oxide and of silicon in their construction.

Such cells have been described in U.S. Pat. No. 4,146,657, which is incorporated by reference in the present application and which discloses a process for forming fluorine-doped tin oxide layers with such high electrical conductivity that they can be used advantageously as transparent electrodes covering a light-absorbing base material for solar cells made, for example, from silicon. This structure eliminated the need for an expensive and fragile grid of fine metallic lines which serve as an upper electrode in conventional solar cells.

The electrical resistance of these fluorine-doped tin oxide transparent electrodes is satisfactorily and consistently low, when measured with current flowing in the plane of the film. However, current flow between the tin oxide film and the silicon underneath, has been found to be impeded sometimes by an "interfacial resistance" between the two layers. Such interfacial resistance, when present, reduces the overall efficiency of a solar cell.

One means to reduce this interfacial resistance, is to provide an electrically conductive layer of titanium dioxide between the tin oxide and silicon, as disclosed in U.S. Pat. No. 4,338,482, the disclosure of which is incorporated herein by reference. It would be advantageous, however, to be able to reduce this interfacial resistance still further, in order in increase the efficiency of such cells.

One feature of the present invention is the improvement of thermal stability of a photovoltaic cell structure containing a transparent, electrically conductive metal oxide layer and a light-absorbing semiconductive photovoltaic layer, particularly a tin oxide-silicon photovoltaic solar cell. Another feature is the further reduction of electrical resistance of such cells in which an intermediate layer of titanium dioxide is employed. Other features will be apparent from the following description.

The present invention comprises the interposition of a layer of transition metal nitride, carbide or boride, particularly titanium nitride, between the light-absorbing semiconductive photovoltaic layer and the transparent electrically conductive metal oxide layer. The resulting composite structure has significantly improved thermal stability and electrical resistance. The advantages of this new structure arise from a uniquely appropriate combination of properties of materials used. Transition metal nitrides, carbides and borides are compounds with metallic electrical conductivity which make very low-resistance electrical contact to electrically conductive metal oxides such as doped tin dioxide as well as to light-absorbing photovoltaic layers, particularly doped silicon. Interfacial electrical resistance between titanium nitride and tin dioxide has been measured to be less than 0.1 ohm for an area of one square centimeter; moreover, the adherence between the layers is tenacious, it being extremly difficult or impossible to peel or scratch one layer from the other. Similar characteristics are found between the titanium nitride layer and a doped silicon layer. In both cases the desired characteristics are retained at temperatures as high as 600° C. or even higher. In contrast, a layer of doped tin dioxide in contact with a layer of doped silicon develops high interfacial electrical resistance even at temperatures as low as 200° C. and with increasing rapidity as the temperature is increased. Since temperatures of 400° C. or higher are required to form the most highly electrically conductive and transparent coatings of metal oxide such as tin dioxide, the importance of the present invention is clear. While many of the nitrides, carbides and borides such as titanium nitride, display pronounced color and hence are not transparent to all visible frequencies of light waves, the extreme thinness of the layer (just a few atomic layers thick) required to lower interfacial electrical resistance results in insignificant optical absorption.

The photovoltaic cell structures to which the present invention applies include those in which any conventional semiconductive photovoltaic layer is present, such as silicon, either crystalline or amorphous, gallium arsenide or indium phosphide containing appropriate dopants. Of these, silicon is particularly important.

The transparent electrically conductive layer of metal oxide may be, for example, tin oxide (principally tin dioxide), indium oxide, cadmium oxide, cadmium stannate, or the like, each containing an appropriate dopant. Tin oxide doped with fluorine is particularly useful. Particularly preferred are those cell structures in which the transparent electrically conductive layer of metal oxide includes a transparent electrically conductive layer of titanium dioxide at its inner face as described in U.S. Pat. No. 4,338,482.

Among the nitrides, carbides and borides of transition metals which can be used in the present invention are those of titanium, zirconium, hafnium, vanadium, niobium, tantalum, chromium, molybdenum, and tungsten. Because chemical vapor deposition of the borides and carbides requires much higher temperatures than does deposition of the nitrides, and because high temperatures tend to degrade and photovoltaic layer, particularly in the case of silicon, the nitrides are preferred. Because titanium is less expensive and more abundant than other transition metals, titanium nitride is preferred to other metal nitrides.

Thin films of transition metal nitrides, carbides and borides, including titanium nitride can be produced by many different techniques, including vacuum evaporation, reactive sputtering, glow discharge methods, and chemical vapor deposition. The simplest and least expensive of these methods is chemical vapor deposition, in which a gas mixture reacts at a heated surface to produce the desired film. Chemical vapor deposition is also advantageous for producing the cell structure of the present invention, since the transparent layer of metallic oxide e.g., tin oxide can also be applied by chemical vapor deposition in the same apparatus immediately following deposition onto the photovoltaic layer of the transition metal nitride, carbide or boride. Such a rapid sequence of depositions minimizes oxidation or contamination of the nitride, carbide or boride film surface. Such oxidation or contamination might occur if the cell were handled or stored between depositions.

When titanium nitride is employed in the present invention, no separate step is needed to provide a layer of titanium dioxide adjacent the inner face of the metal oxide if the metal oxide layer is formed by chemical vapor deposition because conditions of the latter deposition cause superficial oxidation of the exposed titanium nitride surface even when the depositions are carried out in rapid succession. If the titanium oxide layer is very thin, of the order of 0.5-2 nm, as is formed by oxidation of titanium nitride during subsequent deposition of a thin oxide layer, no dopant is required since such a thin layer is not detrimental to the electrical performance of the cell. Thicker layers of titanium dioxide, up to 100 nm or more in thickness, are desirable because by reducing internal reflection, they increase the transmission of light through the entire structure. However, a dopant is desirable in the case of such thicker layers of titanium dioxide to prevent an undesirable increase in electrical resistance. The most desirable dopants for reducing the resistance of the titanium oxide layer are niobium, tantalum and fluorine, as disclosed in U.S. Pat. No. 4,338,482.

Several chemical vapor deposition methods are known in the art for producing films of titanium nitride. The vapor of tetrakis (dimethylamino) titanium is known (see Sugiyama, Pac, Takahashi and Motojima, *J. Electrochemical Society*, Vol. 122, p. 1545 (1975) to decompose, forming titanium nitride films, but this reactant is expensive and reactive to air and water. Also, the temperature of this reaction is too low to be easily compatible with deposition of good tin oxide films. Titanium tetrachloride vapor and nitrogen gas are known to react to produce titanium nitride, but at temperatures of the order of 900°-1000° C., too high to maintain the quality of the silicon substrates at the level desired. A more suitable reaction occurs between titanium tetrachloride vapor and an excess of ammonia which deposits a film of titanium nitride on substrates at a temperature of 400°-600° C., preferably 450 to 550° C. This temperature range is satisfactory for silicon cell substrates, and is also compatible with conditions for depositing a high quality transparent electrode of tin oxide according to U.S. Pat. No. 4,146,657. The titanium tetrachloride and ammonia should be mixed in close proximity to and just before application to the substrate, since they form a solid adduct if mixed at lower temperatures prior to deposition.

Figure 1:
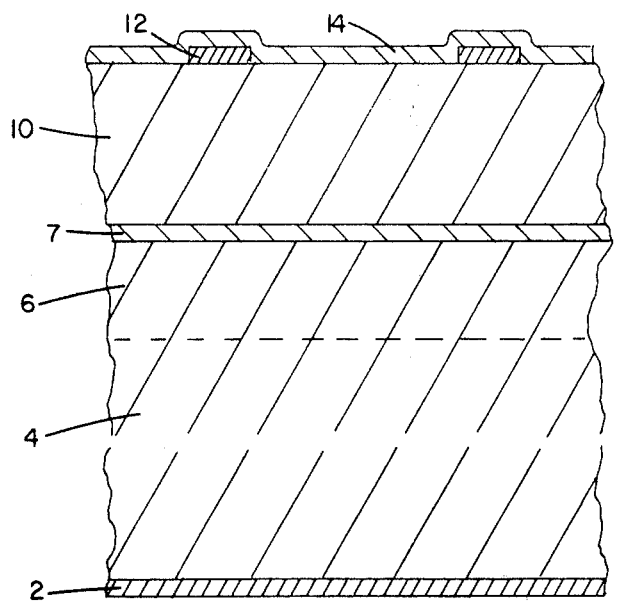
FIG. 1 is a schematic view in section showing one embodiment of the cell structure of the present invention.

Referring to FIG. 1, base photovoltaic layer 4 is a conventional light-absorbing layer approximately 100-300 micrometers thick rendered semiconductive by appropriate dopants. In the case of the usual silicon layer, it is doped with boron to be p-type through most of its thickness and heavily doped in a thin upper zone 6 (approximately 0.6 micron thick) with phosphorus to promote good electrical contact with layer 7 of transition metal nitride, boride or carbide which is of the order of 0.5-2 nm in thickness. This layer is in turn covered with a layer 10 of visibly transparent electrically conductive metal oxide or salt which may be approximately 0.1-2 microns in thickness. Metal front contacts 12 of nickel in the form of a grid and back electrode 2 of aluminum complete the essential cell structure, but an optional antireflection layer 14 of silica can be deposited on the upper face to a thickness of about 0.1-2 microns. Alternatively, the silicon layer can be doped with phosphorus to be n-type throughout most of its thickness, and heavily doped with boron to be p-type adjacent its upper surface, as is well known in the art.

Figure 2:
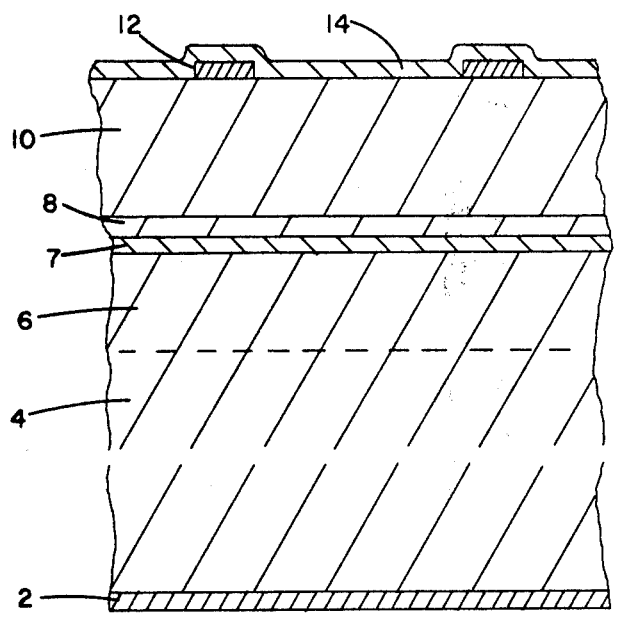
FIG. 2 is a schematic view in section showing a second embodiment.

In the embodiment shown in FIG. 2, there is provided, in addition to the layers shown in FIG. 1, a layer 8 of substantially transparent titanium dioxide doped with niobium, tantalum or fluorine.

Figure 3:
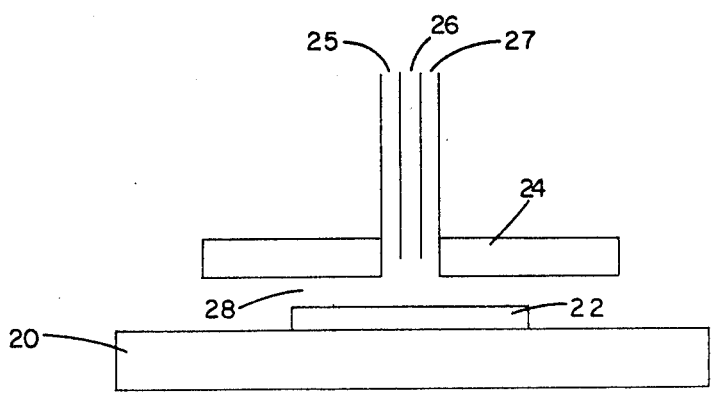
FIG. 3 is a schematic view in section showing apparatus for making cell structures according to the invention.

There is illustrated in FIG. 3 apparatus for forming the cell structure of the present invention. The bare, doped photovoltaic layer 22, e.g. a conventional doped silicon wafer, is placed on heater 20 with a gas distributor plate 24 mounted in spaced relation above it. Suitable reactive vapors are introduced through apertures 25, 26, 27 so that they mix and react with each other in the desired sequence in space 28 in contact with or in close proximity to the wafer 22. Vacuum evaporation, sputtering or glow discharge may also be employed to deposit the desired layer on the face of the wafer 22, as is well known in the art.

The following specific examples are intended to illustrate more clearly the nature of the present invention without acting as a limitation upon its scope.

EXAMPLE 1

A crystalline silicon solar cell blank (n+/p type) is placed on the heater 20 at a temperature of about 500° C. A gas mixture of 4% by volume hydrogen, 2% HF and the balance nitrogen carrier gas is passed through inlet slot 26 and over the wafer for a few seconds, until the thin silicon dioxide layer normally present on silicon is etched away. Then anhydrous ammonia gas is passed through slots 25 and 27, while a mixture of 0.02% titanium tetrachloride vapor in helium carrier gas is passed through slot 26 for a few seconds. The gas flow rates are adjusted so that about 20 moles of ammonia are mixed with each mole of titanium tetrachloride, and each volume of the reactive gas mixture spends about 0.1 sec in the heated reaction zone 28. The distributor plate 24 above the gases is held at a temperature of about 350° C. This deposition produced a layer of titanium nitride about 1 to 2 nanometers thick.

Next, a layer of fluorine-doped tin oxide is formed, by switching the gas mixture to 1.0% by volume tetramethyltin $(CH_3)_4Sn$, 3.0% bromotrifluoromethane $CF_3Br$, and the balance dry air, for about one minute, which form a layer about 1 micron thick.

The resulting coated cell has a sheet resistance of about 3 ohms per square on the upper surface. There is negligible interfacial resistance between the metal oxide layer and the silicon, as is demonstrated by the high fill factor when the whole structure is tested as a solar cell.

A cell made for comparison, omitting the titanium nitride layer, shows a high interfacial resistance of about 20 ohms $cm^2$, and a reduced efficiency.

EXAMPLE 2

Example 1 is repeated, except that after the titanium nitride deposition, and before the tin oxide deposition, the heater 20 is rapidly raised to a temperature of about 640° C. Then the tin oxide deposition is carried out for about 30 seconds, yielding a film about 1 micron thick. The sheet resistance of the coated cell is now reduced to about 1 ohm per square, showing that a higher quality tin oxide film has been deposited at the higher temperature. The interfacial resistance between the cell and the coatings remains very low.

EXAMPLE 3

A solar cell is produced as in Example 1, with the additional step that after the titanium nitride deposition, and before the tin oxide deposition, an electrically conductive layer of titanium oxide doped with niobium is deposited; a gas mixture containing 0.2% by volume titanium (IV) i-propoxide $Ti(OC_3H_7)_4$, 0.02% niobium (V) ethoxide $Nb(OC_2H_5)_5$, 4% hydrogen, and the balance nitrogen is passed over the titanium nitride coated silicon for about one minute. This gas mixture is formed by injecting a liquid mixture of the titanium (IV) i-propoxide and the niobium (V) ethoxide into the hydrogen-nitrogen mixture at about 200° C., using a syringe pump.

The resulting solar cell produced a higher current than the cell of Example 1, because of a lower reflection loss.

The present invention is equally effective when the photovoltaic layer is composed of doped amorphous silicon. For example, an amorphous silicon cell blank can be substituted for the crystalline blank in Example 1 above.

Although temperatures as low as 400° C. can be used for formation of the titanium nitride layer, higher amounts of residual chlorine are present in such products, an undesirable feature. At temperatures above about 600° C. degradation of the silicon tends to occur. The ratio of ammonia to titanium tetrachloride may be varied over a wide range, from about 5 to about 100 moles of ammonia per mole of titanium tetrachloride. Below the low end undesirably large amounts of residual chlorine tend to be present in the product, while above the high and excessively long times are required to build up a titanium nitride layer of the desired thickness. The thickness of the nitride layer may range from about 1 to about 4 nm, preferably from 1 to 2 nm. Thinner layers tend to fail to produce the desired benefits, while thicker layers tend to be opaque to visible light.

What is claimed is:

1. In a photovoltaic cell structure containing a transparent, electrically conductive first layer of metal oxide and a light-absorbing semiconductive photovoltaic second layer, the improvement comprising an electrically conductive layer consisting of from 0.5 to 4 nm in thickness of transition metal nitride, carbide or boride interposed between said first and second layers.

2. A structure as defined in claim 1, wherein said transition metal is selected from the metals titanium, zirconium, hafnium, vanadium, niobium, tantalum, chromium, molybdenum and tungsten.

3. A structure as defined in claim 1, in which the transition metal is titanium.

4. A structure as defined in claims 1, 2 or 3, in which the interposed layer comprises a nitride.

5. A structure as claimed in claims 1, 2 or 3 in which the thickness of said interposed layer is from 1 to 2 nm.

6. A structure as defined in claims 1, 2, 3 or 4, in which the photovoltaic second layer comprises silicon.

7. A structure as defined in claim 1 in which said first layer comprises tin oxide, said second layer comprises silicon, and said interposed layer comprises titanium nitride.

8. A structure as defined in claim 1 in which said first layer comprises titanium oxide at the side adjacent said interposed layer and tin oxide at the opposite side, said second layer comprises silicon, and said interposed layer comprises titanium nitride.

9. A structure as defined in claim 8 in which said second layer comprises amorphous silicon.

10. A structure as claimed in claims 7, 8 or 9 in which the thickness of said interposed layer is from 1 to 2 nm.

* * * * *